United States Patent
Gadiraju et al.

(10) Patent No.: US 11,456,688 B2
(45) Date of Patent: Sep. 27, 2022

(54) SYSTEMS AND METHODS FOR OPERATING A POWER GENERATING ASSET

(71) Applicant: General Electric Renovables Espana, S.L., Barcelona (ES)

(72) Inventors: Kasi Viswanadha Raju Gadiraju, Bangalore (IN); Joseph Lawrence Chacon, Greenville, SC (US); Steven Wade Sutherland, Roanoke, VA (US); Arvind Kumar Tiwari, Niskayuna, NY (US)

(73) Assignee: General Electric Renovables Espana, S.L., Barcelona (ES)

( * ) Notice: Subject to any disclaimer, the term of this patent is extended or adjusted under 35 U.S.C. 154(b) by 0 days.

(21) Appl. No.: 17/106,301

(22) Filed: Nov. 30, 2020

(65) Prior Publication Data
US 2022/0173681 A1    Jun. 2, 2022

(51) Int. Cl.
*H02P 9/02* (2006.01)
*G01R 31/327* (2006.01)
*H02K 7/18* (2006.01)

(52) U.S. Cl.
CPC .............. *H02P 9/02* (2013.01); *G01R 31/327* (2013.01); *H02K 7/183* (2013.01)

(58) Field of Classification Search
CPC .......... H02P 9/02; G01R 31/327; H02K 7/183
See application file for complete search history.

(56) References Cited

U.S. PATENT DOCUMENTS

| | | | |
|---|---|---|---|
| 7,800,248 B2 | 9/2010 | Kramer et al. | |
| 2006/0267560 A1* | 11/2006 | Rajda | F03D 9/257 323/209 |

(Continued)

FOREIGN PATENT DOCUMENTS

| | | |
|---|---|---|
| CA | 2475556 A1 | 1/2006 |
| CN | 202550291 U | 11/2012 |

(Continued)

OTHER PUBLICATIONS

Extended European Search Report for EP application No. 21208190. 5., dated Apr. 22, 2022.

(Continued)

*Primary Examiner* — Sean Gugger
(74) *Attorney, Agent, or Firm* — Dority & Manning, P.A.

(57) ABSTRACT

A system and method are provided for operating a power generating asset having a generator operably coupled to a power grid. The generator having a rotor and a stator. The stator being operably coupled to a transformer, and ultimately to the power grid, via a sync-switch assembly. The sync-switch assembly having a plurality of switching devices electrically coupled in parallel. Accordingly, a controller detects an approach of at least one operating parameter of the power generating asset to a first parameter threshold. In response to detecting the approach of the operating parameter to the first parameter threshold, the controller independently changes an operating state of a first switching device of the plurality of switching devices of the sync-switch assembly. Each switching device of the plurality of switching devices is independently controllable via the controller.

18 Claims, 6 Drawing Sheets

(56) References Cited

U.S. PATENT DOCUMENTS

2016/0285252 A1* 9/2016 Burra .................. H02P 9/107
2020/0235581 A1* 7/2020 Wang ................... H02P 9/02
2021/0184666 A1* 6/2021 Strzalkowski ......... H03K 17/18

FOREIGN PATENT DOCUMENTS

| CN | 203039243 U | 7/2013 |
| CN | 110556267 A | 12/2019 |
| CN | 110718418 A | 1/2020 |
| CN | 210092889 U | 2/2020 |
| CN | 107359645 B | 7/2020 |
| EP | 2876808 A2 | 5/2015 |
| EP | 3460970 A1 | 3/2019 |
| WO | WO2006/008781 A1 | 1/2006 |
| WO | WO2008/145191 A1 | 12/2008 |

OTHER PUBLICATIONS

Mollik M.S. et al., Review on Solid-State Transfer Switch Configurations and Control Methods: Applications, Operations, Issues, and Future Directions, IEEE Access, IEEE USA, vol. 8, Oct. 5, 2020, pp. 182490-182505.

* cited by examiner

SYSTEMS AND METHODS FOR OPERATING A POWER GENERATING ASSET

FIELD

The present disclosure relates in general to power generating assets, and more particularly to systems and methods for operating power generating assets coupled to a power grid via a sync-switch assembly.

BACKGROUND

As disclosed herein, power generating assets may take a variety of forms and may include power generating assets which rely on renewable and/or nonrenewable sources of energy. Those power generating assets which rely on renewable sources of energy may generally be considered one of the cleanest, most environmentally friendly energy sources presently available. For example, wind turbines have gained increased attention in this regard. A modern wind turbine typically includes a tower, a generator, a gearbox, a nacelle, and one or more rotor blades. The nacelle includes a rotor assembly coupled to the gearbox and to the generator. The rotor assembly and the gearbox are mounted on a bedplate support frame located within the nacelle. The rotor blades capture kinetic energy of wind using known airfoil principles. The rotor blades transmit the kinetic energy in the form of rotational energy so as to turn a shaft coupling the rotor blades to a gearbox, or if a gearbox is not used, directly to the generator. The generator then converts the mechanical energy to electrical energy and the electrical energy may be transmitted to a converter and/or a transformer housed within the tower and subsequently deployed to a utility grid. Modern wind power generation systems typically take the form of a wind farm having multiple wind turbine generators that are operable to supply power to a transmission system providing power to a power grid.

Typically, the power generating asset may be coupled to the power grid via a sync-switch. The sync-switch may serve to connect or disconnect the power generating asset to the power grid based on the operating parameters of the power generating asset and/or the power grid. Accordingly, the sync-switch must have sufficient electrical capacity to transmit electrical power at the operating voltage of the generator. Additionally, the sync-switch must also have sufficient mechanical endurance to remain operational through frequent operational cycles of the sync-switch. For example, during low-wind seasons, wind speed variations may be very high. These variations may result in frequent synchronization and disconnection of the power generating asset from the grid, necessitating correspondingly frequent operational cycles of the sync-switch. In certain voltage ranges, limited options may exist for sync-switches having the necessary electrical capacity and mechanical endurance. This, may, in turn, necessitate the utilization of over-sized or custom-designed sync-switches, which may increase the cost of the power generating asset.

In view of the aforementioned, the art is continuously seeking new and improved systems and methods for operating a power generating asset which is operably coupled to a power grid via a sync-switch.

BRIEF DESCRIPTION

Aspects and advantages of the invention will be set forth in part in the following description, or may be obvious from the description, or may be learned through practice of the invention.

In one aspect, the present disclosure is directed to a method for operating a power generating asset having a generator with a rotor and a stator. The stator may be operably coupled to a transformer, and ultimately to a power grid, via a sync-switch assembly. The sync-switch assembly may have a plurality of switching devices electrically coupled in parallel. The method may include detecting, via a controller, an approach of at least one operating parameter of the power generating asset to a first parameter threshold. The method may also include independently changing, via the controller, an operating state of a first switching device of the plurality of switching devices of the sync-switch assembly in response to the detected approach. Each switching device of the plurality of switching devices may be independently controllable via the controller.

In an embodiment, the method may also include detecting, via the controller, an approach of the at least one operating parameter to a second parameter threshold. Additionally, the method may include independently changing, via the controller, an operating state of a second switching device of the sync-switch assembly.

In an additional embodiment, the approach of the power generating asset to the first and second parameter thresholds may be a first approach to the first and second parameter thresholds, respectively. Accordingly, the method may also include detecting, via the controller, a second approach of the power generating asset to the second parameter threshold. Further, the method may include independently changing, via the controller, the operating state of the first switching device of the sync-switch assembly.

In a further embodiment, the approach of the power generating asset to the first and second parameter thresholds may be a first approach to the first and second parameter thresholds, respectively. Accordingly, the method may include detecting, via the controller, a second approach of the power generating asset to the second parameter threshold and independently changing the operating state of the second switching device of the sync-switch assembly.

In yet a further embodiment, the method may include independently changing, via the controller, the operating state of the first switching device following the change in the operating state of the second switching device.

In an embodiment, the method may include determining, via the controller, a switching sequence for each of the plurality of switching devices. The switching sequence may be based on a rotational schedule or a randomization.

In an additional embodiment, the method may include determining a capability rating for each of the plurality of switching devices. Additionally, the method may include determining, via the controller, a switching sequence for the plurality of switching devices for a given parameter of the power generating asset based on the capability rating of each switching device of the plurality switching devices.

In a further embodiment, the method may include receiving, via the controller, a usage parameter for each of the plurality of switching devices. The usage parameter may include data indicative of a cycle count and/or a time-under-current from an installation date. The method may also include determining, via the controller, a switching sequence for the plurality of switching devices based on the usage parameter for each switching device. The switching sequence may be configured to distribute a usage burden across the plurality of switching devices so as to preclude an overutilization of a portion of the switching devices.

In yet a further embodiment, the method may include determining a capability rating for each of the plurality switching devices so as to determine a capability-based switching sequence for the plurality of switching devices. The method may also include receiving, via the controller, a usage parameter for each of the plurality of switching devices. The usage parameter may include data indicative of a cycle count and/or a time-under-current from an installation date so as to determine a usage-based switching sequence for the plurality switching devices. Additionally, the method may include receiving, via the controller, a rotational schedule corresponding to a scheduled switching sequence for the plurality of switching devices. The method may include applying a weighting factor to each of the capability-based switching sequence, the usage-based switching sequence and the scheduled switching sequence. Furthermore, the method may include determining, via the controller, a consolidated switching sequence based on the weighting of the capability-based switching sequence, the usage-based switching sequence, and the scheduled switching sequence.

In an embodiment, the plurality of switching devices may include a contactor, a breaker, and/or a hybrid switching element.

In an additional embodiment, the plurality of switching devices may include at least the contactor and the breaker. The breaker may have a higher power rating than the contactor and the contactor may have a higher duty-cycle rating than the breaker.

In an additional embodiment, the first switching device may have a capability rating which differs from a capability rating of the second switching device.

In a further embodiment, the method may include receiving, via the controller, an error signal from the sync-switch assembly indicative of a failure of at least one of the plurality of switching devices. Additionally, the method may include implementing a control action in response to the error signal.

In yet a further embodiment, implementing the control action may include determining, via the controller, a reduced power rating for the sync-switch assembly due to the failure of the switching device(s). Additionally, the method may include derating, via the controller, the power generating assets so as to establish a power output of the power generating asset which is less than the reduced power rating of the sync-switch assembly.

In an embodiment, the method may include receiving, via the controller, a usage parameter for each of the plurality of switching devices and/or a power parameter. The usage parameter may include data indicative of a cycle count and/or a time-under-current over a specified sampling period. The power parameter may be indicative of a power transmitted through each of the switching devices. The method may also include determining, via the controller, a state-of-health rating for each of the plurality of switching devices based on the usage parameter and/or the power parameter. The method may also include determining a state-of-health threshold for each of the plurality of switching devices. The method may include detecting, via the controller, an approach of the state-of-health rating for at least one switching device of the plurality switching devices to the state-of-health threshold. In response to the approach of the state-of-health rating to the state-of-health threshold, the method may include implementing a control action.

In an additional embodiment, the method may include receiving, via the controller, a usage parameter for each of the plurality of switching devices. The usage parameter may include data indicative of a cycle count and/or a time-under-current. The method may also include correlating, via the controller, the usage parameter to a usage interval and determining a lifecycle threshold for each of the plurality of switching devices. The lifecycle threshold may correspond to a usage level at which a potential for switching device failure exceeds a predetermined level. Based on the correlation and the lifecycle threshold, the method may include determining, via the controller, a number of intervals until the lifecycle threshold is reached.

In another aspect, the present disclosure is directed to a system for operating a power generating asset. The system may include a generator comprising a rotor and a stator. The system may also include a sync-switch assembly comprising a plurality of switching devices electrically coupled in parallel. The sync-switch assembly may couple the stator to a transformer, and ultimately to a power grid. Additionally, the system may include a controller communicatively coupled to the sync-switch assembly. The controller may include at least one processor configured to perform a plurality of operations. The plurality of operations may include any of the operations and/or features described herein.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

Figure 1:
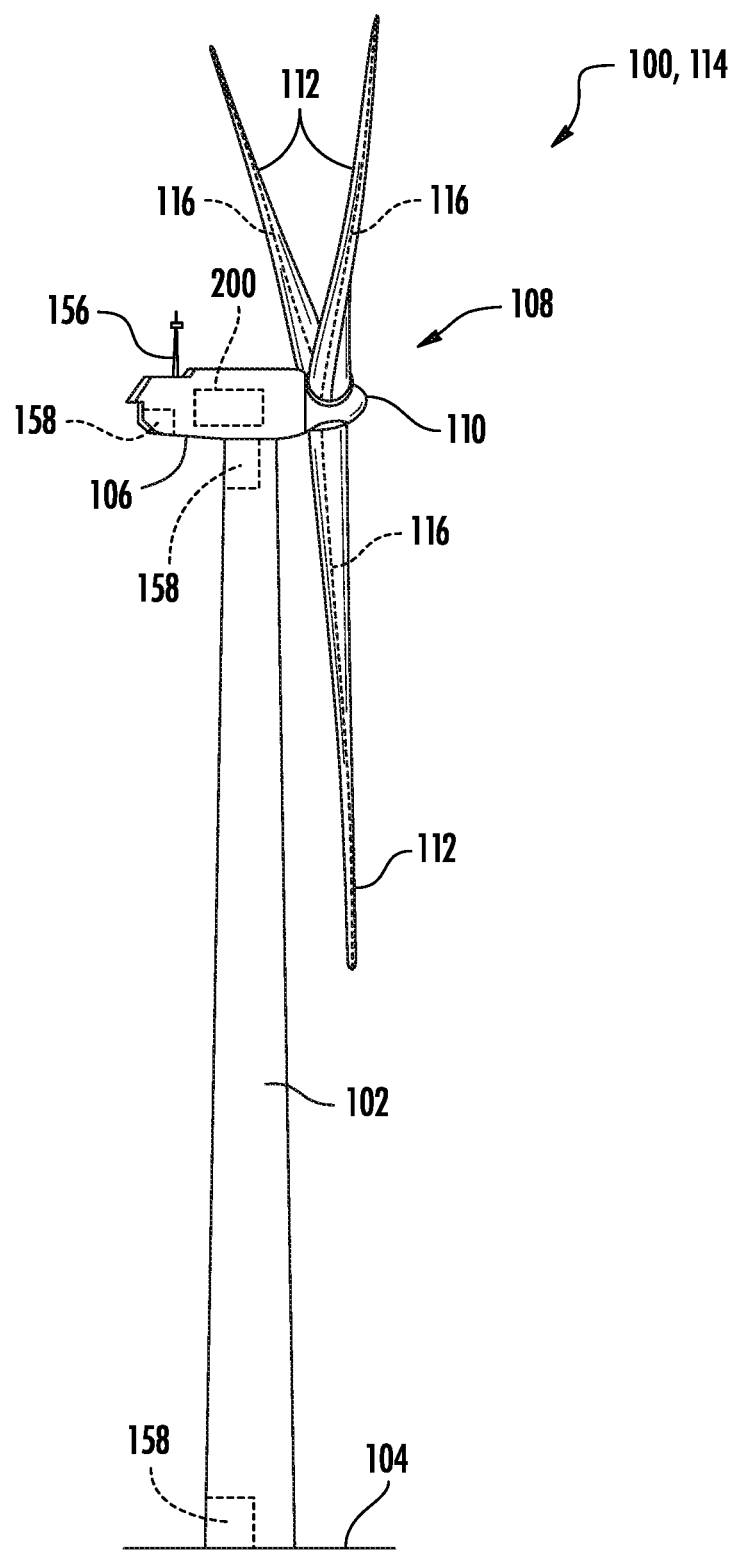
FIG. 1 illustrates a perspective view of one embodiment of a power generating asset configured as a wind turbine according to the present disclosure.

Repeat use of reference characters in the present specification and drawings is intended to represent the same or analogous features or elements of the present invention.

DETAILED DESCRIPTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment.

Thus, it is intended that the present invention covers such modifications and variations as come within the scope of the appended claims and their equivalents.

The terms "coupled," "fixed," "attached to," and the like refer to both direct coupling, fixing, or attaching, as well as indirect coupling, fixing, or attaching through one or more intermediate components or features, unless otherwise specified herein.

Generally, the present disclosure is directed to enhancing the life expectancy of synchronization devices (e.g. a sync-switch) of the power generating asset. The systems and methods disclosed herein may be particularly desirable when the generator is designed to operate within a voltage range for which very few switching devices may be available that have the requisite voltage range and ampacity. For example, a power generating asset may be configured with a generator having a stator voltage in a range of one kilovolt to three kilovolts inclusive. In this voltage range the number of available switching devices may be very limited. In contrast, numerous switching devices may be available for stator voltages below one kilovolt or greater than five kilovolts. Consequently, the utilization of a generator having a stator voltage in the 1-3 kilovolt range may necessitate the utilization of over-sized switching devices, such as those designed to operate at greater than five kilovolts, and/or custom-designed switching devices. It should be appreciated that the utilization of over-sized switching devices and/or custom-designed switching devices may increase costs.

In order to provide switching devices configured to operate in the necessary voltage range with the required ampacity but without necessitating utilization of over-sized/custom-designed switching devices, the present disclosure includes systems and methods which facilitate the utilization of multiple "standard/low-cost" switching devices arranged in parallel as a sync-switch assembly. However, as disclosed herein, the multiple switching devices may not be configured to function as a single unit in response to a single command signal, but rather may be configured to be individually controllable in response to a number of command signals. For example, when the input to the power generating asset (e.g. wind speed) is low and the generated current may be handled by a single switching device, only a single switching device may be closed while the remainder of the switching devices of the sync-switch assembly may remain open. Should the input increase, additional switching devices may be closed to handle the additional current. Similarly, as the input decreases, the switching devices may be individually opened in accordance with the various control schemes described herein. For example, as the input decreases, each of the switching devices may receive a respective command signal which directs the simultaneous opening of all of the switching devices.

In addition to individually controlling the switching devices of the sync-switch assembly, additional benefits may be realized via the utilization of various types of switching devices within the sync-switch assembly. For example, the sync-switch assembly may include at least one contactor and at least one breaker. As such, a contactor with high mechanical endurance may be employed in combination with a circuit breaker exhibiting less mechanical endurance than the contactor but a greater electrical capacity. Such a combination may result in an optimization of electrical capacity, mechanical endurance (e.g. durability), and cost.

Accordingly, the present disclosure includes systems and methods which facilitate the utilization of a sync-switch assembly that includes multiple, independently controllable switching devices coupled in parallel. More specifically, the power generating asset may have a generator. The generator may include a rotor and a stator. The stator may be operably coupled to a transformer, and ultimately to the power grid, via the sync-switch assembly. In such a configuration, a controller may detect an approach of at least one operating parameter of the power generating asset to a first parameter threshold. In response to detecting the approach of the operating parameter(s) to the first parameter threshold, the controller may independently change an operating state of a first switching device of the plurality of switching devices of the sync-switch assembly. Additionally, the controller may detect an approach of the operating parameter(s) to a second parameter threshold. In response to detecting the approach to the second threshold, the controller may independently change an operating state of a second switching device of the sync-switch assembly.

Referring now to the drawings, FIG. 1 illustrates a perspective view of one embodiment of a power generating asset 100 according to the present disclosure. As shown, the power generating asset 100 may be configured as a wind turbine 114. In an additional embodiment, the power generating asset 100 may, for example, be configured as a solar power generating asset, a hydroelectric plant, a fossil fuel generator, and/or a hybrid power generating asset.

Figure 2:
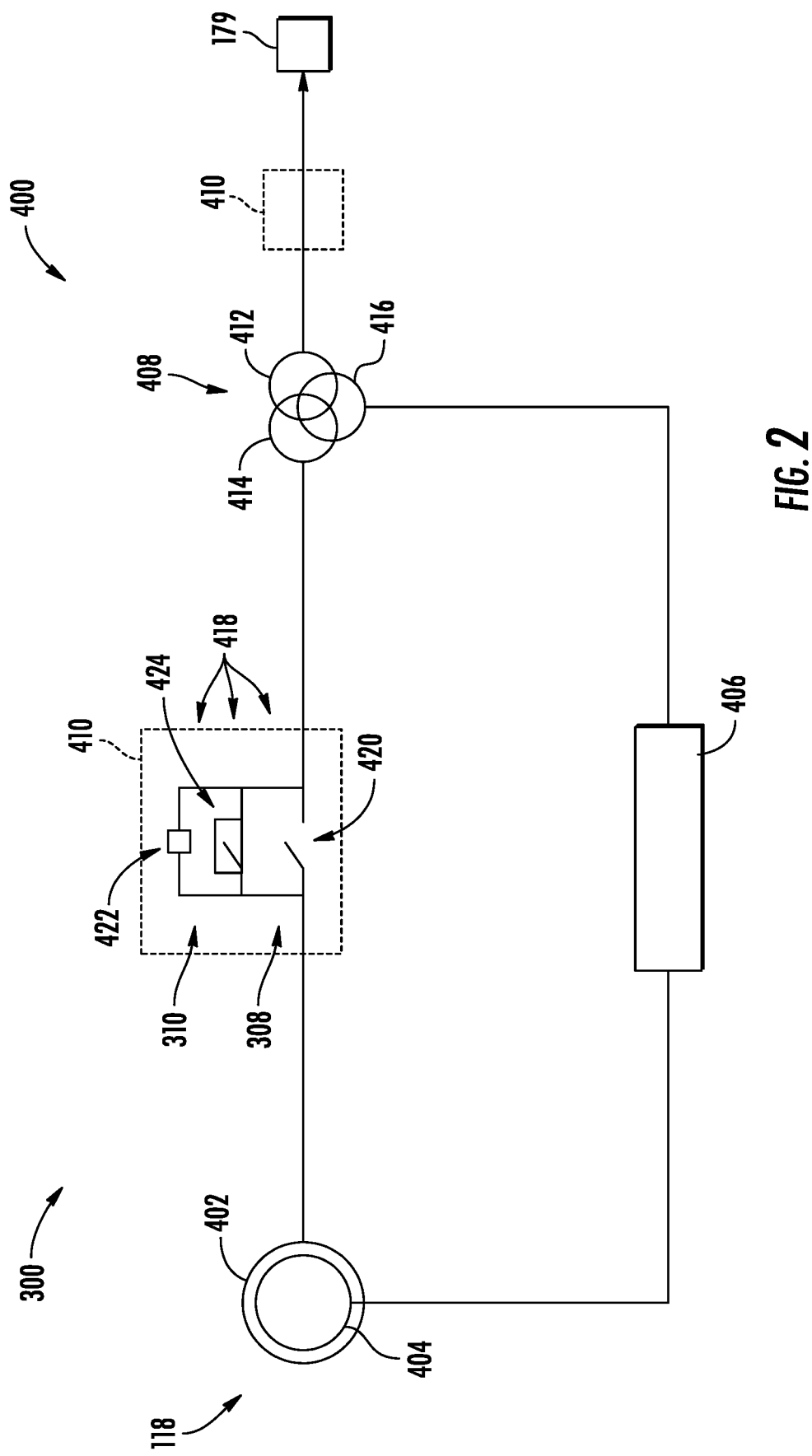
FIG. 2 illustrates a schematic diagram of one embodiment of an electrical system for use with the wind turbine according to the present disclosure.

When configured as a wind turbine 114, the power generating asset 100 may generally include a tower 102 extending from a support surface 104, a nacelle 106, mounted on the tower 102, and a rotor 108 coupled to the nacelle 106. The rotor 108 may include a rotatable hub 110 and at least one rotor blade 112 coupled to, and extending outwardly from, the hub 110. For example, in the illustrated embodiment, the rotor 108 includes three rotor blades 112. However, in an additional embodiment, the rotor 108 may include more or less than three rotor blades 112. Each rotor blade 112 may be spaced about the hub 110 to facilitate rotating the rotor 108 to enable kinetic energy to be transferred from the wind into usable mechanical energy, and subsequently, electrical energy. For instance, the hub 110 may be rotatably coupled to an electric generator 118 (FIG. 2) of an electrical system 400 (FIG. 2) positioned within the nacelle 106 to permit electrical energy to be produced and delivered to a power grid 179 (FIG. 2).

The power generating asset for 100 may also include a controller 200. When configured as a wind turbine 114, the controller 200 may be configured as a turbine controller centralized within the nacelle 106. However, in other embodiments, the controller 200 may be located within any other component of the power generating asset 100 or at a location outside the power generating asset. Further, the controller 200 may be communicatively coupled to any number of the components of the power generating asset 100 in order to control the components. As such, the controller 200 may include a computer or other suitable processing unit. Thus, in several embodiments, the controller 200 may include suitable computer-readable instructions that, when implemented, configure the controller 200 to perform various different functions, such as receiving, transmitting and/or executing wind turbine control signals.

Each rotor blade 112 may also include a pitch control mechanism configured to rotate each rotor blade 112 about its pitch axis 116. It should be appreciated that pitching the rotor blade(s) 112 about the pitch axis may impact the amount of power produced by the wind turbine 114. For example, in order to de-power the wind turbine 114, such as in response to a de-rating of the wind turbine 114, the rotor blade (s) 112 may be pitched in the direction of feather wherein the angle of attack relative to the wind is reduced.

In several embodiments, the power generating asset 100 may include at least one environmental sensor 156 for monitoring at least one environmental condition affecting the power generating asset 100. In an embodiment, the environmental sensor(s) 156 may, for example, be a wind vane, an anemometer, a lidar sensor, thermometer, barometer, or any other suitable sensor. An environmental data set gathered by the environmental sensor(s) 156 may include measures of wind direction, wind speed, wind shear, wind gust, wind veer, atmospheric pressure, pressure gradient and/or temperature. Thus, the environmental data set may define the conditions in which the power generating asset 100 is operating and, therefore, may facilitate the determination of an expected performance of the power generating asset 100 based on the prevailing environmental conditions. In at least one embodiment, the environmental sensor(s) 156 may be mounted to the nacelle 106 at a location downwind of the rotor 108. It should be appreciated that the environmental sensor(s) 156 may include a network of sensors and may be positioned away from the power generating asset 100.

In addition, the power generating asset 100 may include one or more operational sensors 158. The operational sensor(s) 158 may be configured to detect a performance of the power generating asset 100 in response to the environmental condition. The operational sensor(s) 158 may be configured to monitor multiple parameters associated with the performance and/or health of a component of the power generating asset 100. For example, the operational sensor(s) 158 may monitor parameters associated with vibrations, audible signals, visual indications, angular positions, rotational velocities, bending moments, power consumption, power generation, temperature and/or other suitable parameters. For example, the operational sensor(s) 158 may be configured to monitor a plurality of electrical conditions, such as slip, stator voltage and current, rotor voltage and current, and line-side voltage and current at each of three phases of power. Accordingly, the operational sensor(s) 158 may, in an embodiment, be an ammeter, a voltmeter, an ohmmeter, and/or any other suitable sensor for monitoring the power of the power grid 179 and/or the power output of the wind turbine 114. Further, in an embodiment, the operational sensor(s) 158 may be an analog tachometer, a direct current (DC) tachometer, an alternating current (AC) tachometer, a digital tachometer, a contact tachometer, a non-contact tachometer, or a time and frequency tachometer.

It should also be appreciated that, as used herein, the term "monitor" and variations thereof indicates that the various sensors of the power generating asset 100 may be configured to provide a direct measurement of the parameters being monitored or an indirect measurement of such parameters. Thus, the sensors described herein may, for example, be used to generate signals relating to the parameter being monitored, which can then be utilized by the controller 200 to determine a condition or response of the power generating asset 100.

Referring now to FIG. 2 a simplified electrical system 400 of the power generating asset 100 is illustrated. In an embodiment, the electrical system 400 may include various components for converting the kinetic energy of the rotor 108 into an electrical output in an acceptable form to the connected power grid 179. For example, in an embodiment, the generator 118 may be a doubly-fed induction generator (DFIG) having a stator 402 and a generator rotor 404. The generator rotor 404 may be coupled to a power converter 406 which is operably coupled to a transformer 408. The stator 402 may, in an embodiment, be coupled to the power grid 179 via a sync-switch assembly 410. In an embodiment, the sync-switch assembly 410 may be coupled between the stator 402 and the transformer 408. In an alternative embodiment, the sync-switch assembly 410 may be coupled between the transformer 408 and the power grid 179.

As further depicted in FIG. 2, the transformer 408 may, in an embodiment, be a 3-winding transformer which includes a primary winding 412, a secondary winding 414 and an auxiliary winding 416. The primary winding 412 may be coupled to the power grid 179, while the secondary winding 414 may be operably coupled to the stator 402. Additionally, the auxiliary winding 416 may be operably coupled to the converter 406. It should be appreciated that the transformer 408 can be a three-winding transformer as depicted, or alternatively, may be a two-winding transformer having only a primary winding 412 and a secondary winding 414; may be a four-winding transformer having a primary winding 412, a secondary winding 414, and auxiliary winding 416, and an additional auxiliary winding; or may have any other suitable number of windings.

The sync-switch assembly 410 may include a plurality of switching devices 418 electrically coupled in parallel. In an embodiment, the plurality of switching devices 418 may include a contactor 420, a breaker 422 (e.g. a circuit breaker), and/or a hybrid switching element 424, which combines mechanical and electronic devices. It should be appreciated that the sync-switch assembly 410 may include any number of contactors 420, breakers 422 and/or hybrid switching elements 424 connected in parallel and may include multiples of each type of switching device 418.

In an embodiment, the plurality of switching devices 418 may include at least one contactor 420 and at least one breaker 422. In such an embodiment, the breaker 422 may have a greater power rating (e.g. electrical capacity) than the contactor 420. However, the contactor 420 may have a higher duty-cycle rating than the breaker 422. In other words, in an embodiment, the breaker 422 may be configured to transmit a greater current load then the contactor 420 without tripping or being damaged, but the contactor 420 may have a greater mechanical endurance and be configured to change operating states (e.g. open/close) a greater number of times than the breaker 422 without degradation.

Figure 3:
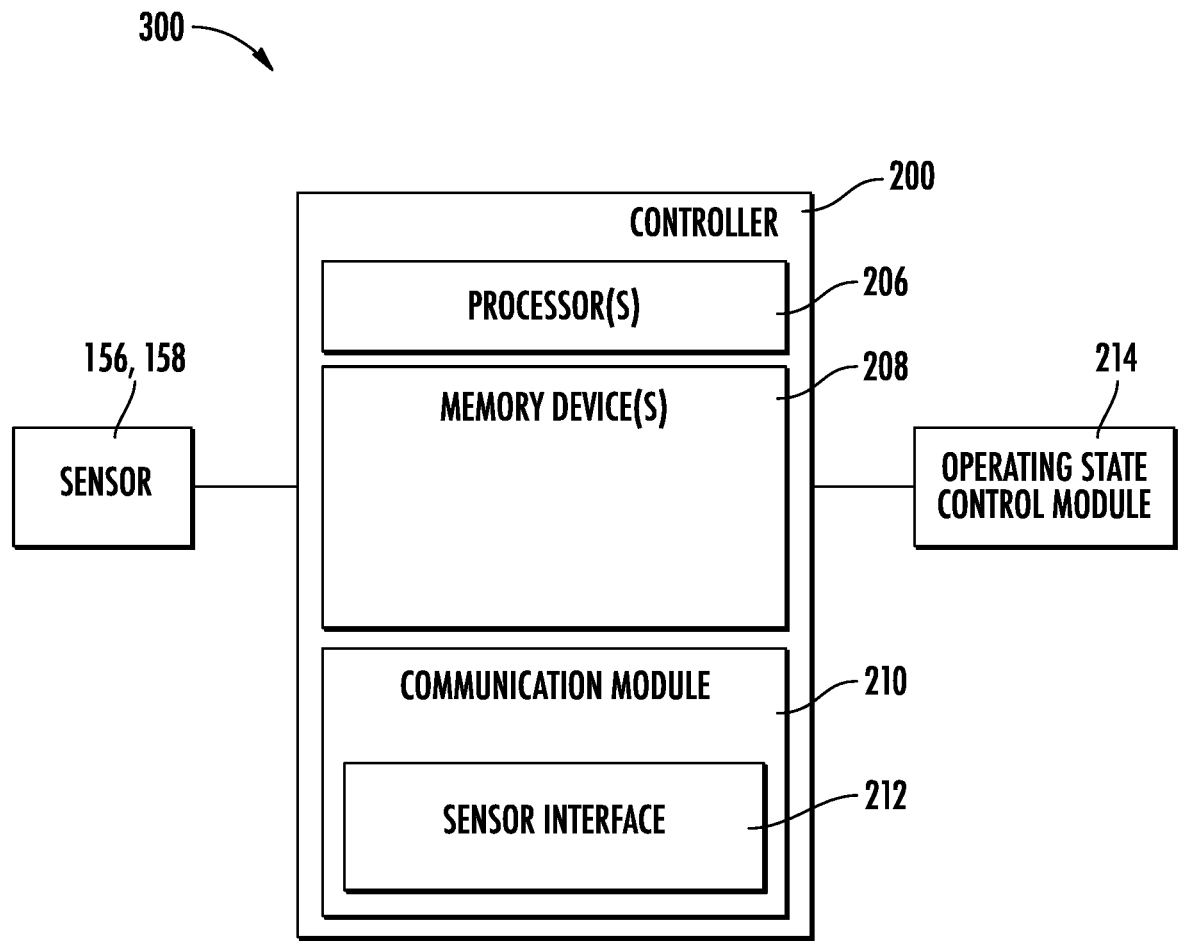
FIG. 3 illustrates a schematic diagram of one embodiment of a controller according to the present disclosure.
Figure 4:
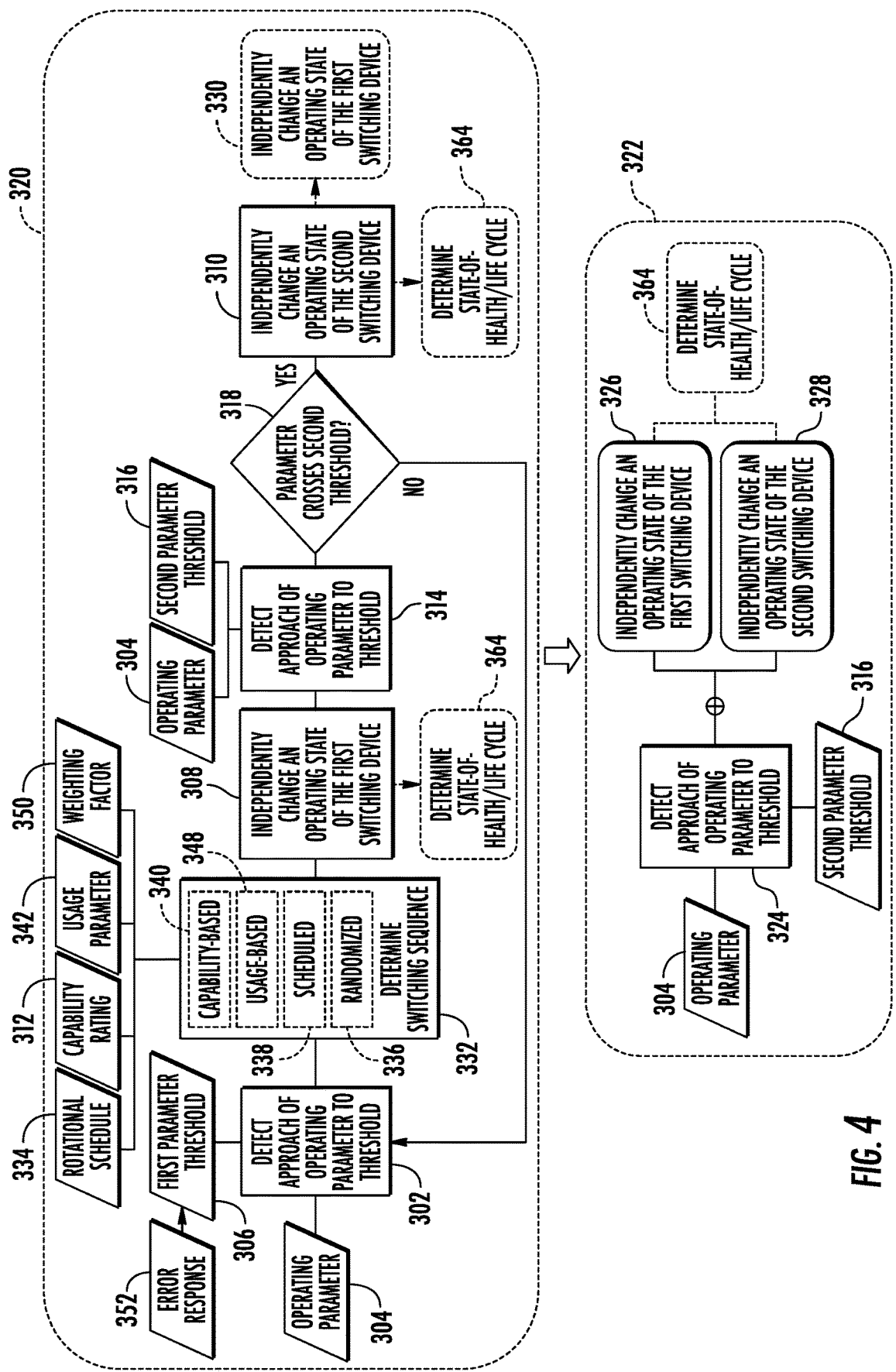
FIG. 4 illustrates a schematic diagram of one embodiment of a control logic of a system for operating a power generating asset according to the present disclosure.
Figure 5:
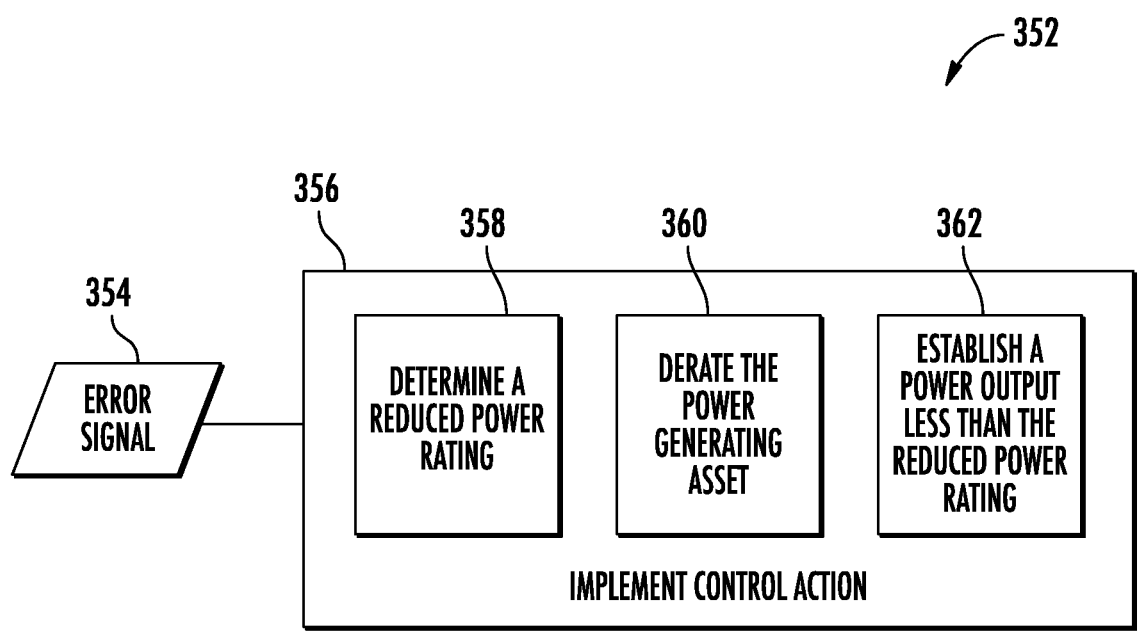
FIG. 5 illustrates a flow diagram of one embodiment of an expanded portion of the control logic of FIG. 4 according to the present disclosure.
Figure 6:
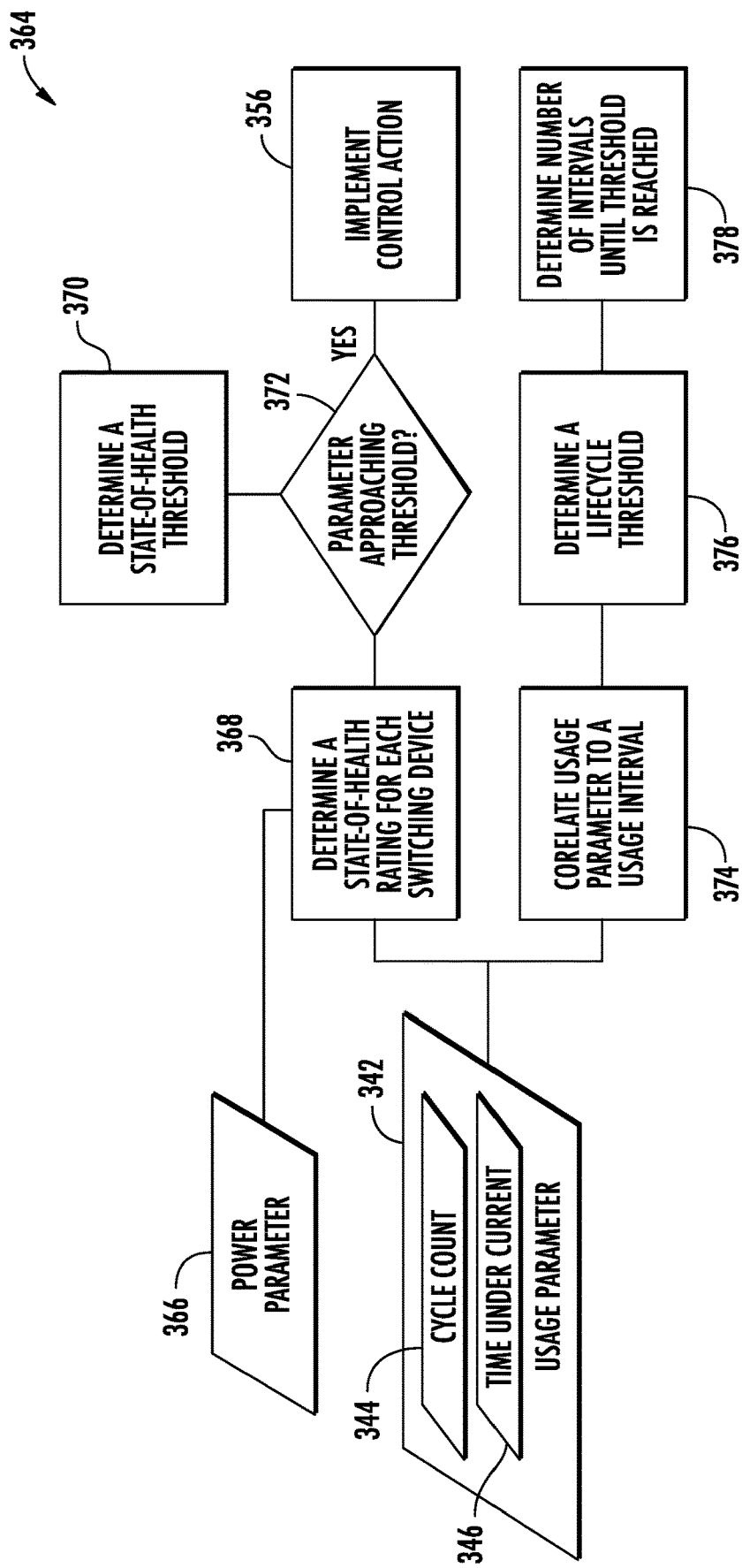
FIG. 6 illustrates a flow diagram of one embodiment of an expanded portion of the control logic of FIG. 4 according to the present disclosure.

Referring still to FIG. 2 and also to FIGS. 3-6, various aspects of multiple embodiments of a system 300 for operating the power generating asset 100 according to the present disclosure are presented. For example, as described herein, the system 300 may be utilized for operating the wind turbine 114 described above. However, it should be appreciated that the disclosed system 300 may be used any other power generating asset 100 having any suitable configuration. In addition, although FIGS. 4-6 depict steps performed in a particular order for purposes of illustration and discussion, the methods and steps described herein are not limited to any particular order or arrangement. One skilled in the art using the disclosures provided herein, will appreciate that various steps of the method may be omitted, rearranged, combined and/or adapted in various ways.

As shown particularly in FIG. 3, a schematic diagram of one embodiment of suitable components that may be included within the controller 200 is illustrated. For example, as shown, the controller 200 may include one or more processor(s) 206 and associated memory device(s) 208 configured to perform a variety of computer-implemented functions (e.g., performing the methods, steps, calculations and the like and storing relevant data as disclosed herein). Additionally, the controller 200 may also include a communications module 210 to facilitate communications between the controller 200, the power generating asset 100, and components thereof. Further, the communications module 210 may include a sensor interface 212 (e.g., one or more analog-to-digital converters) to permit signals transmitted from one or more sensors, such as the environmental sensor(s) 156 and/or the operational sensor(s) 158 to be converted into signals that can be understood and processed by the processors 206. It should be appreciated that the sensors may be communicatively coupled to the communications module 210 using any suitable means. For example, as shown in FIG. 3, the sensors may be coupled to the sensor interface 212 via a wired connection. However, in other embodiments, the sensors 156, 158 may be coupled to the sensor interface 212 via a wireless connection, such as by using any suitable wireless communications protocol known in the art. Additionally, the communications module 210 may also be operably coupled to an operating state control module 214 configured to implement a control action.

As used herein, the term "processor" refers not only to integrated circuits referred to in the art as being included in a computer, but also refers to a controller, a microcontroller, a microcomputer, a programmable logic controller (PLC), an application specific integrated circuit, and other programmable circuits. Additionally, the memory device(s) 208 may generally comprise memory element(s) including, but not limited to, computer readable medium (e.g., random access memory (RAM)), computer readable non-volatile medium (e.g., a flash memory), a floppy disk, a compact disc-read only memory (CD-ROM), a magneto-optical disk (MOD), a digital versatile disc (DVD) and/or other suitable memory elements. Such memory device(s) 208 may generally be configured to store suitable computer-readable instructions that, when implemented by the processor(s) 206, configure the controller 200 to perform various functions including, but not limited to, independently changing the operating states of each of the plurality of switching devices 418 of the sync-switch assembly 410 as described herein, as well as various other suitable computer-implemented functions.

Referring particularly to FIG. 4, in an embodiment, the controller 200 of the system 300 may, as depicted at 302, detect an approach of at least one operating parameter 304 of the power generating asset 100 to a first parameter threshold 306. In response to the detected approach, the controller 200 may, in an embodiment, independently change an operating state of a first switching device 308 of the plurality of switching devices 418. As disclosed herein, each switching device of the plurality of switching devices 418 may be independently controllable via the controller 200. For example, in an embodiment, the first switching device 308 may be in an open operating state while a second switching device 310 may be in a closed operating state. It should be appreciated that a flow of electricity through the switching device(s) 418 may only be established when the switching device(s) 418 is in a closed operating state. It should be appreciated that as used herein, the approach of the operating parameter(s) 304 to a threshold denotes the drawing near of the operating parameter (s) 304 to the threshold. For example, in an embodiment, the operating parameter(s) 304 may approach the threshold when the operating parameter(s) 304 as a value which deviates from the threshold by less than 5% (e.g. less than 1%). It should further be appreciated that the operating parameter (s) 304 may indicate an actual operating parameter value (e.g. power production) of the power generating asset 100 and/or a potential operating parameter value (e.g. power production capability) based on the environmental condition(s) affecting the power generating asset.

In an embodiment, the operating parameter(s) 304 may be a power parameter. For example, the operating parameter(s) 304 may be an indication of an active power component magnitude, a reactive power component magnitude, a generated voltage, and/or a generated current. In an additional embodiment, the operating parameter(s) 304 may be indicative of an operating state of the power generating asset 100 in response to an input, such as an environmental condition monitored by the environmental sensor(s) 156. For example, the operating parameter(s) 304 may be indicative of a shaft rotational speed, a rotor speed, a tip-speed-ratio, and/or a generator speed. Additionally, in an embodiment, the operating parameter(s) 304 may be indicative of a command of the controller 200 directing the establishment of a desired operating state. For example, the operating parameter(s) 304 may correspond to a generator speed setpoint, a generator torque setpoint, a rotor speed setpoint, a pitch setpoint, and/or a tip-speed-ratio setpoint.

In an embodiment, the each switching device 418 may have a capability rating 312 corresponding to a mechanical endurance and/or an electrical capacity. In an embodiment the capability rating 312 for each switching device 418 may be the same or similar. However, in an embodiment, the capability rating 312 of at least one of the plurality of switching devices 418 may differ from the capability rating 312 of at least one additional switching device 418. Accordingly, in an embodiment, the first switching device 308 may have a capability rating 312 which differs from a capability rating 312 of the second switching device 310. For example, in an embodiment, the first switching device 308 may have a relatively high electrical capacity and a moderate mechanical endurance, while the second switching device 310 may have a moderate electrical capacity and a low mechanical endurance.

As depicted at 314, in an embodiment, the controller 200 may detect an approach of the operating parameter(s) 304 to a second parameter threshold 316. In an embodiment wherein the operating parameter(s) 304 crosses the second threshold 316, as depicted at 316, the controller 200 may independently change an operating state of the second switching device 310. As depicted at 318, in an embodiment wherein the operating parameter(s) 304 does not cross the second parameter threshold 316, the operating state of the second switching device 310 may be unchanged.

In an embodiment wherein the operating parameter(s) 304 may be increasing, the second parameter threshold 316 may have a value which is greater than the first parameter threshold 306. For example, in an embodiment wherein the first and second parameter thresholds 306, 316 correspond to a power production level for the power generating asset 100, approaching second parameter threshold 316 may require an increased level of power production than is required to approach the first parameter threshold 306.

By way of illustration, the system 300 may be employed in an embodiment wherein the wind speeds monitored by the environmental sensor(s) 156 are insufficient to support power production by the wind turbine 114, and the wind turbine 114 is disconnected from the power grid 179 by an open operating state of the sync-switch assembly 410. From this initial state, the wind speed may increase and support an increased rotational velocity of the rotor 108 and corresponding power generation level, as reflected by the operating parameter(s) 304. As used herein, the "power generation level" may include the actual power production of the power generating asset 100 and/or the power production capability (e.g. potential power production) of the power generating asset 100 based on the environmental condition(s). As the controller 200 detects an approach of power generation level (e.g. operating parameter(s) 304) to a power generation threshold (e.g. first parameter threshold 306), the controller 200 may independently change the operating state of the first switching device 308 from an open operating state to a closed operating state. Closing the first switching device 308 may electrically couple the generator 118 to the power grid 179. The wind turbine 114 may, in an embodiment, remain coupled to the power grid 179 via only the first switching device 308 so long as the power generation of the wind turbine 114 remains within the operating limits of the first switching device 308. However, as the wind speed increases, a corresponding increase in power generation may result in the operating parameter(s) 304 approaching the second parameter threshold 316. When the controller 200 detects, at 318, the crossing of the second threshold 316, the controller 200 may independently change an operating state of the second switching device 310 from an open operating state to a closed operating state. Closing the second switching device 310 may, in an embodiment, result in the generator 118 being electrically coupled to the power grid 179 via both the first switching device 308 and the second switching device 310. The wind turbine 114 may, in an embodiment, remain coupled to the power grid 179 via both the first and second switching devices 308, 310 until a change in the operating parameter(s) 304 necessitates the closing of additional switching devices 418 or the opening of either the first or second switching device 308, 310, or simultaneously.

Referring still to FIG. 4, in an embodiment, the approach of the power generating asset 100 to the first and second parameter thresholds 306, 316 may be a first approach to the first and second parameter thresholds 306, 316 as indicated by block 320. In an embodiment, operating the power generating asset may result in a second approach of the operating parameter(s) 304 to the second operating parameter 316 as indicated by block 322. For example, in an embodiment wherein the first approach (block 320) of the operating parameter(s) 304 to the second parameter threshold 316 corresponds to an increase in the power production of the power generating asset 100, a decrease in the power production may result the second approach (block 322) of the operating parameter(s) 304 to the second parameter threshold. In other words, once the second parameter threshold 316 has been crossed due to an increase in the operating parameter(s) 304, the second parameter threshold 316 may not be encountered again until a decrease in the operating parameter(s) 304 results in the second approach.

As depicted at 324, in an embodiment, the controller 200 may be configured to detect an approach of the operating parameter(s) 304 to the second parameter threshold 316 during the second approach (block 322). In response to detecting the second approach of the operating parameter(s) 304 to the second parameter threshold 316, the controller 200 may, as depicted at 326, independently change the operating state of the first switching device 308 of the sync-switch assembly 410. Such a switching sequence 332 may be deemed to be a "first closed, first open" or "first in, first out" (FIFO) switching sequence.

It should be appreciated that employing a FIFO switching sequence may facilitate a distribution of a service burden across each of the plurality of switching devices 418. For example, since the second switching device 310 may not be closed until some period after the first switching device 308, the first switching device 308 may accrue more time-under-current 346 then would be logged by the second switching device 310 if the second switching device 310 were opened upon the second approach to the second parameter threshold 316. However, by retaining the second switching device 310 in the closed position and opening the first switching device 308 upon the encountering of the second parameter threshold 316 during the second approach, the time-under-current 346 may be more evenly amongst the plurality of switching devices 418.

In an additional embodiment, the controller 200 may, in response to detecting the second approach of the operating parameter(s) 304 to the second parameter threshold 316 independently change the operating state of the second switching device 310 of the sync-switch assembly 410 as depicted at 328. Such a switching sequence 332 may be deemed to be a "first closed, last open" or "first in, last out" (FILO) switching sequence. In such an embodiment, the switching order employed to close each of the plurality of switching devices 418 during the first approach (block 320) may be reversed during the second approach (block 322).

It should be appreciated that employing a FILO switching sequence may facilitate the maintenance of the first switching device 308 in a closed operating state for a longer duration than the second switching device 310. The utilization of the FILO switching sequence may be particularly beneficial in an embodiment wherein the capabilities of the first switching device 308 warrant an increased time-under-current 346. For example, the first switching device 308 may have a relatively high capability rating 312. This may permit the utilization of the first switching device 308 throughout a majority of an operational envelope of the power generating asset 100 while the second switching device 310 may be employed to augment the first switching device 308 in more extreme operating conditions. Accordingly, it may be desirable to continue operating the first switching device 308 when operating conditions no longer require the employment of the second switching device 310.

As depicted at 330, in an embodiment, the controller 200 may independently change the operating state of the first switching device 308 following the change in the operating state of the second switching device 310. For example, in an embodiment wherein the first switching device is a contactor 420 and the second switching device is a breaker 422, the current capacity of the breaker 422 relative to the contactor 420 may permit the utilization of the breaker 422 at current levels which may degrade the contactor 420. Accordingly, it may be desirable to open the contactor 420 in sequence with the closing of the breaker 422 so that the current load is carried by the breaker 422. In such an embodiment, the breaker 422 may be maintained in the closed operating state until opened by the controller 200 to disconnect the generator 118 from the power grid 179.

In an embodiment, the controller 200 may be configured to determine a switching sequence 332. The switching sequence 332 may designate and order in which each of the plurality of switching devices 418 may be opened and/or closed. For example, in an embodiment, the switching sequence may be based on a rotational schedule 334 or randomized. In an embodiment, the rotational schedule 334 may be received via the controller 200 and may correspond to a scheduled switching sequence 338 for the plurality of switching devices 418. It should be appreciated that both the scheduled switching sequence 338 and a randomized switching sequence 336 may serve to level a distribution of the operational burden across the plurality of switching devices 418. Such an approach may be particularly beneficial in an embodiment wherein the plurality of switching devices 418 may include a single type of switching device and thus capability rating. It should further be appreciated that the utilization of the scheduled switching sequence 338 may provide level of predictability to the switching sequence, while the utilization of the randomized switching sequence 336 may counter unpredictable operational patterns which may result in an uneven distribution of the operational burden across the plurality of switching devices 418.

In an additional embodiment, the capability rating 312 may be determined for each of the plurality of switching devices 418. In such an embodiment, the controller 200 may determine a capability-based switching sequence 340 for the plurality of switching devices 418. The capability-based switching sequence 340 may be based on the capability rating 312 for each switching device of the plurality of switching devices 418 for a given operating parameter(s) 304. For example, in an embodiment, the operating parameter(s) 304 may correspond to an indication of current and the capability rating 312 may indicate a current carrying capability of each of the switching devices 418. In an additional embodiment, the operating parameter(s) 304 may correspond to an indication of variability in the power output of the generator 118, such as may result from fluctuating wind conditions. In such an embodiment, the capability rating 312 may correspond to the mechanical endurance of the switching devices 418 as the instability in the power output may necessitate frequent changes in the operating state of the switching devices 418.

In an embodiment, the controller 200 may receive a usage parameter 342 for each of the plurality of switching devices 418. The usage parameter 342 may include data indicative of a cycle count 344 and/or a time-under-current 346 measured from an installation date. The cycle count 344 may, in an embodiment correspond to a number of operating state changes experienced by the switching device 418 the installation of the switching device 418. In an embodiment, the time-under-current 346 may indicate an amount of time during which each of the switching devices 418 may have been subjected to a current load. Accordingly, the controller 200 may determine a usage-based switching sequence 348 for the plurality of switching devices 418 based on the usage parameter 342 for each switching device of the plurality of switching devices 418. The usage-based switching sequence 348 may be configured to distribute a usage burden across the plurality of switching devices 418 so as to preclude an overutilization of a portion of the switching devices 418.

In an embodiment, determining the switching sequence 332 may include determining a consolidated switching sequence. In order to determine the consolidated switching sequence, a weighting factor 350 may be applied to each of the capability-based switching sequence 340, the usage-based switching sequence 348 and the scheduled switching sequence 338. By applying the weighting factor to each of the switching sequences 338, 340, 348, the switching order of each switching device of the plurality of switching devices 418 as determined by the individual switching sequences 338, 340, 348, may be altered in accordance with overarching control prioritization scheme of the controller 200. The altered switching orders may then be consolidated by the controller 200 into the consolidated switching sequence.

Referring now to FIG. 5 wherein a portion of the control logic of system 300 corresponding to an error response 352 is depicted. In an embodiment, the controller 200 may receive an error signal 354 from the sync-switch assembly 410. The error signal 354 may be indicative of a failure of at least one of the plurality of switching devices 418. In response to the receipt of the error signal 354, the controller 200 may implement a control action 356. In an embodiment, implementing the control action 356 may include determining a reduced power rating 358 for the sync-switch assembly 410 due to the failure of the switching device(s) 418. As depicted at 360, the controller 200 may derate the power generating asset 100. In response to the derating of the power generating asset 100, the power output of the power generating asset 100 may, as depicted at 362, be established at a magnitude which is less than the reduced power rating 358 for the sync-switch assembly 410. For example, the power output of the power generating asset 100 may be established at a magnitude which does not exceed a reduced electrical capacity of the sync-switch assembly 410 stemming from the failure the switching device(s) 418.

Referring now to FIG. 6 wherein a portion of the control logic of system 300 corresponding to a determination, as depicted in block 364 of a state-of-health/lifecycle of the switching devices 418 is depicted. In an embodiment, the controller 200 may receive at least one usage parameter 342 for each of the plurality of switching devices 418 and a power parameter 366. The usage parameter(s) 342 may include data indicative of the cycle count 344 and/or the time-under-current 346 over a specified sampling period. In an embodiment, the power parameter 366 may be indicative of a power transmitted through each of the switching devices 418.

In an embodiment, the controller 200 may determine a state-of-health rating 368 for each of the plurality of switching devices 418 based on the usage parameter 342 and/or the power parameter 366. Additionally, in an embodiment, a state-of-health threshold 370 may be determined for each of the plurality of switching devices 418. The controller 200 may, in an embodiment, employ the state-of-health threshold 370 to detect, at 372, an approach of the state-of-health rating 368 for at least one switching device of the plurality of switching devices 418 to the state-of-health threshold 370. Upon detecting the approach of the state-of-health rating 368 to the state-of-health threshold 370, the controller 200 may, in an embodiment, implement a control action 356.

In an embodiment, the control action 356 may include generating an alarm. The generation of the alarm may facilitate the scheduling of a maintenance event in order to address the switching device(s) 418 having a state-of-health rating 368 approaching the state-of-health threshold 370. Accordingly, the alarm may include an auditory signal, a visual signal, an alert, a notification, a system input, and/or any other system which may identify the root cause to an operator. It should be appreciated that the control action 356 as described herein may further include any suitable command or constraint by the controller 200. For example, in an embodiment, the control action 356 may include temporarily derating the power generating asset 100. Additionally, in an embodiment, the control action 356 may include limiting an operation of at least one component of the power generating asset. For example, the control action 356 may limit a pitching of a rotor blade 112 so as to limit power production of the wind turbine 114.

Referring still to FIG. 6, in an embodiment, the controller 200 may correlate the usage parameter 342 to a usage interval 374. The usage interval 374 may indicate an amount of time required to accumulate the usage parameter 342. For example, the correlation may indicate that a certain cycle count 344 may have been achieved over a specified period of time (e.g. hours, months, years, etc.). Thus, the correlation may be deemed to be a "usage rate" for the plurality of switching devices 418.

In an embodiment, a lifecycle threshold 376 may be determined for each of the plurality of switching devices

418. The lifecycle threshold 376 may correspond to a usage level at which a potential for switching device failure exceeds a predetermined level. The lifecycle threshold 376 may, for example equate to a design-service life for each of the plurality of switching devices 418. As such, the lifecycle threshold 376 may, in an embodiment, equate to a nominal number of hours-under-current during which the corresponding switching devices 418 may be expected to continue functioning properly.

In an embodiment, the correlation of the usage parameter 342 to the usage interval 374 and the lifecycle threshold 376 may be utilized by the controller 200 to determine a number of expected intervals 378 until the lifecycle threshold 376 may be reached. In other words, the correlation and the lifecycle threshold 376 may indicate an expected lifecycle remaining for each of the plurality of switching devices 418. This determination may, in an embodiment, be utilized to schedule a service activity and/or implement any other appropriate control action 356.

Furthermore, the skilled artisan will recognize the interchangeability of various features from different embodiments. Similarly, the various method steps and features described, as well as other known equivalents for each such methods and feature, can be mixed and matched by one of ordinary skill in this art to construct additional systems and techniques in accordance with principles of this disclosure. Of course, it is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

Further aspects of the invention are provided by the subject matter of the following clauses:

Clause 1. A method for operating a power generating asset having a generator with a rotor and a stator, the stator being operably coupled to a transformer via a sync-switch assembly, the sync-switch assembly having a plurality of switching devices electrically coupled in parallel, the method comprising: detecting, via a controller, an approach of at least one operating parameter of the power generating asset to a first parameter threshold; and independently changing, via the controller, an operating state of a first switching device of the plurality of switching devices of the sync-switch assembly in response to the detected approach, wherein each switching device of the plurality of switching devices is independently controllable via the controller.

Clause 2. The method of clause 1, further comprising: detecting, via the controller, an approach of the at least one operating parameter to a second parameter threshold; and independently changing, via the controller, an operating state of a second switching device of the sync-switch assembly.

Clause 3. The method of any preceding clause, wherein the approach at least one operating parameter of the power generating asset to the first and second parameter thresholds is a first approach to the first and second parameter thresholds, respectively, the method further comprising: detecting, via the controller, a second approach of the at least one operating parameter to the second parameter threshold; and independently changing, via the controller, the operating state of the first switching device of the sync-switch assembly.

Clause 4. The method of any preceding clause, wherein the approach of the power generating asset to the first and second parameter thresholds is a first approach to the first and second parameter thresholds, respectively, the method further comprising: detecting, via the controller, a second approach at least one operating parameter to the second parameter threshold; and independently changing, via the controller, the operating state of the second switching device of the sync-switch assembly.

Clause 5. The method of any preceding clause, further comprising: independently changing, via the controller, the operating state of the first switching device following the change in the operating state of the second switching device. \

Clause 6. The method of clause, further comprising: determining, via the controller, a switching sequence for each of the plurality of switching devices, wherein the switching sequence is based on one of a rotational schedule and a randomization.

Clause 7. The method of any preceding clause, further comprising: determining a capability rating for each of the plurality of switching devices; and determining, via the controller, a switching sequence for the plurality of switching devices for a given operating parameter of the power generating asset based on the capability rating of each switching device of the plurality of switching devices.

Clause 8. The method of any preceding clause, further comprising: receiving, via the controller, a usage parameter for each of the plurality of switching devices, the usage parameter comprising data indicative of at least one of a cycle count and a time-under-current from an installation date; determining, via the controller, a switching sequence for the plurality of switching devices based on the usage parameter for each switching device, wherein the switching sequence is configured to distribute a usage burden across the plurality of switching devices so as to preclude an overutilization of a portion of the switching devices.

Clause 9. The method of any preceding clause, further comprising: determining a capability rating for each of the plurality of switching devices so as to determine a capability-based switching sequence for the plurality of switching devices; receiving, via the controller, a usage parameter for each of the plurality of switching devices, the usage parameter comprising data indicative of at least one of a cycle count and a time-under-current from an installation date so as to determine a usage-based switching sequence for the plurality of switching devices; receiving, via the controller, a rotational schedule corresponding to a scheduled switching sequence for the plurality of switching devices; applying a weighting factor to each of the capability-based switching sequence, the usage-based switching sequence, and the scheduled switching sequence; and determining, via the controller, a consolidated switching sequence based on the weighting of the capability-based switching sequence, the usage-based switching sequence, and the scheduled switching sequence.

Clause 10. The method of any preceding clause, wherein the plurality of switching devices comprises at least one of a contactor, a breaker, and a hybrid switching element.

Clause 11. The method of any preceding clause, wherein the plurality of switching devices comprises at least the contactor and the breaker, wherein the breaker has a higher power rating than the contactor, and wherein the contactor has a higher duty-cycle rating than the breaker.

Clause 12. The method of any preceding clause, wherein the first switching device has a capability rating which differs from a capability rating of the second switching device.

Clause 13. The method of any preceding clause, further comprising: receiving, via the controller, an error signal from the sync-switch assembly indicative of a failure of at least one switching device of the plurality of switching devices; and implementing a control action in response to the error signal.

Clause 14. The method of any preceding clause, wherein implementing the control action comprises: determining, via the controller, a reduced power rating for the sync-switch assembly due to the failure of the at least one switching device; and derating, via the controller, the power generating asset so as to establish a power output of the power generating asset which is less than the reduced power rating of the sync-switch assembly.

Clause 15. The method of any preceding clause, further comprising: receiving, via the controller, at least one of a usage parameter for each of the plurality of switching devices and a power parameter, wherein the usage parameter comprises data indicative of at least one of a cycle count and a time-under-current over a specified sampling period, and wherein the power parameter is indicative of a power transmitted through each of the switching devices; determining, via the controller, a state-of-health rating for each of the plurality of switching devices based on at least one of the usage parameter and the power parameter; determining a state-of-health threshold for each of the plurality of switching devices; detecting, via the controller, an approach of the state-of-health rating for at least one switching device of the plurality switching devices to the state-of-health threshold; and implementing a control action in response to the approach of the state-of-health rating to the state-of-health threshold.

Clause 16. The method of any preceding clause, further comprising: receiving, via the controller, a usage parameter for each of the plurality of switching devices, wherein the usage parameter comprises data indicative of at least one of a cycle count and a time-under-current; correlating, via the controller, the usage parameter to a usage interval; determining a lifecycle threshold for each of the plurality of switching devices, the lifecycle threshold corresponding to a usage level at which a potential for switching device failure exceeds a predetermined level; and based on the correlation and the lifecycle threshold, determining, via the controller, a number of intervals until the lifecycle threshold is reached.

Clause 17. A system for operating a power generating asset, the system comprising: a generator comprising a rotor and a stator; a sync-switch assembly comprising a plurality of switching devices electrically coupled in parallel, wherein the sync-switch assembly operably couples the stator to a transformer; and a controller communicatively coupled to the at least one sensor, the controller comprising at least one processor configured to perform a plurality of operations, the plurality of operations comprising: detecting an approach of at least one operating parameter of the power generating asset to a first parameter threshold, and independently changing an operating state of a first switching device of the plurality of switching devices of the sync-switch assembly in response to the detected approach, wherein each switching device of the plurality of switching devices is independently controllable via the controller.

Clause 18. The system of any preceding clause, wherein the plurality of operations further comprise: detecting an approach of the at least one operating parameter to a second parameter threshold; and independently changing an operating state of a second switching device of the sync-switch assembly.

Clause 19. The system of any preceding clause, wherein the approach of the power generating asset to the first and second parameter thresholds is a first approach to the first and second parameter thresholds, respectively, the method further comprising: detecting a second approach of the power generating asset to the second parameter threshold; and independently changing, via the controller, the operating state of the first switching device of the sync-switch assembly.

Clause 20. The system of any preceding clause, wherein the approach of the power generating asset to the first and second parameter thresholds is a first approach to the first and second parameter thresholds, respectively, the method further comprising: detecting a second approach of the power generating asset to the second parameter threshold; and independently changing the operating state of the second switching device of the sync-switch assembly.

What is claimed is:

1. A method for operating a power generating asset having a generator with a rotor and a stator, the stator being operably coupled to a transformer via a sync-switch assembly, the sync-switch assembly having a plurality of switching devices electrically coupled in parallel, the method comprising:
   detecting, via a controller, an approach of at least one operating parameter of the power generating asset to a first parameter threshold;
   detecting, via the controller, an approach of the at least one operating parameter to a second parameter threshold;
   independently changing, via the controller, an operating state of a first switching device of the plurality of switching devices of the sync-switch assembly in response to the detected approach of the at least one operating parameter of the power generating asset to the first parameter threshold, wherein each switching device of the plurality of switching devices is independently controllable via the controller; and
   independently changing, via the controller, an operating state of a second switching device of the plurality of switching devices of the sync-switch assembly in response to the detected approach of the at least one operating parameter of the power generating asset to the second parameter threshold.

2. The method of claim 1, wherein the approach of the at least one operating parameter of the power generating asset to the first parameter threshold and the second parameter threshold is a first approach to the first parameter threshold and the second parameter threshold, respectively, the method further comprising:

detecting, via the controller, a second approach of the at least one operating parameter to the second parameter threshold; and
independently changing, via the controller, the operating state of the first switching device of the sync-switch assembly based on the second approach.

3. The method of claim 1, wherein the approach of the at least one operating parameter of the power generating asset to the first parameter threshold and the second parameter threshold is a first approach to the first parameter threshold and the second parameter threshold, respectively, the method further comprising:
detecting, via the controller, a second approach of the at least one operating parameter to the second parameter threshold; and
independently changing, via the controller, the operating state of the second switching device of the sync-switch assembly based on the second approach.

4. The method of claim 1, further comprising:
independently changing, via the controller, the operating state of the first switching device following the change in the operating state of the second switching device.

5. The method of claim 1, further comprising:
determining, via the controller, a switching sequence for each of the plurality of switching devices, wherein the switching sequence is based on one of a rotational schedule and a randomization.

6. The method of claim 1, further comprising:
determining a capability rating for each of the plurality of switching devices; and
determining, via the controller, a switching sequence for the plurality of switching devices for a given operating parameter of the power generating asset based on the capability rating of each switching device of the plurality of switching devices.

7. The method of claim 1, further comprising:
receiving, via the controller, a usage parameter for each of the plurality of switching devices, the usage parameter comprising data indicative of at least one of a cycle count and a time-under-current from an installation date;
determining, via the controller, a switching sequence for the plurality of switching devices based on the usage parameter for each switching device, wherein the switching sequence is configured to distribute a usage burden across the plurality of switching devices so as to preclude an overutilization of a portion of the switching devices.

8. The method of claim 1, further comprising:
determining a capability rating for each of the plurality of switching devices so as to determine a capability-based switching sequence for the plurality of switching devices;
receiving, via the controller, a usage parameter for each of the plurality of switching devices, the usage parameter comprising data indicative of at least one of a cycle count and a time-under-current from an installation date so as to determine a usage-based switching sequence for the plurality of switching devices;
receiving, via the controller, a rotational schedule corresponding to a scheduled switching sequence for the plurality of switching devices;
applying a weighting factor to each of the capability-based switching sequence, the usage-based switching sequence, and the scheduled switching sequence; and
determining, via the controller, a consolidated switching sequence based on the weighting of the capability-based switching sequence, the usage-based switching sequence, and the scheduled switching sequence.

9. The method of claim 1, wherein the plurality of switching devices comprises at least one of a contactor, a breaker, and a hybrid switching element.

10. The method of claim 9, wherein the plurality of switching devices comprises at least the contactor and the breaker, wherein the breaker has a higher power rating than the contactor, and wherein the contactor has a higher duty-cycle rating than the breaker.

11. The method of claim 1, wherein the first switching device has a capability rating which differs from a capability rating of the second switching device.

12. The method of claim 1, further comprising:
receiving, via the controller, an error signal from the sync-switch assembly indicative of a failure of at least one switching device of the plurality of switching devices; and
implementing a control action in response to the error signal.

13. The method of claim 12, wherein implementing the control action comprises:
determining, via the controller, a reduced power rating for the sync-switch assembly due to the failure of the at least one switching device; and
derating, via the controller, the power generating asset so as to establish a power output of the power generating asset which is less than the reduced power rating of the sync-switch assembly.

14. The method of claim 1, further comprising:
receiving, via the controller, at least one of a usage parameter for each of the plurality of switching devices and a power parameter, wherein the usage parameter comprises data indicative of at least one of a cycle count and a time-under-current over a specified sampling period, and wherein the power parameter is indicative of a power transmitted through each of the switching devices;
determining, via the controller, a state-of-health rating for each of the plurality of switching devices based on at least one of the usage parameter and the power parameter;
determining a state-of-health threshold for each of the plurality of switching devices;
detecting, via the controller, an approach of the state-of-health rating for at least one switching device of the plurality switching devices to the state-of-health threshold; and
implementing a control action in response to the approach of the state-of-health rating to the state-of-health threshold.

15. The method of claim 1, further comprising:
receiving, via the controller, a usage parameter for each of the plurality of switching devices, wherein the usage parameter comprises data indicative of at least one of a cycle count and a time-under-current;
correlating, via the controller, the usage parameter to a usage interval;
determining a lifecycle threshold for each of the plurality of switching devices, the lifecycle threshold corresponding to a usage level at which a potential for switching device failure exceeds a predetermined level; and
based on the correlation and the lifecycle threshold, determining, via the controller, a number of intervals until the lifecycle threshold is reached.

16. A system for operating a power generating asset, the system comprising:
- a generator comprising a rotor and a stator;
- a sync-switch assembly comprising a plurality of switching devices electrically coupled in parallel, wherein the sync-switch assembly operably couples the stator to a transformer; and
- a controller communicatively coupled to the sync-switch assembly, the controller comprising at least one processor configured to perform a plurality of operations, the plurality of operations comprising:
  - detecting an approach of at least one operating parameter of the power generating asset to a first parameter threshold;
  - detecting an approach of the at least one operating parameter to a second parameter threshold;
  - independently changing an operating state of a first switching device of the plurality of switching devices of the sync-switch assembly in response to the detected approach of the at least one operating parameter of the power generating asset to the first parameter threshold, wherein each switching device of the plurality of switching devices is independently controllable via the controller; and
  - independently changing, via the controller, an operating state of a second switching device of the plurality of switching devices of the sync-switch assembly in response to the detected approach of the at least one operating parameter of the power generating asset to the second parameter threshold.

17. The system of claim 16, wherein the approach of the at least one operating parameter of the power generating asset to the first parameter threshold and the second parameter threshold is a first approach to the first parameter threshold and the second parameter threshold, respectively, the plurality of operations further comprising:
- detecting a second approach of the power generating asset to the second parameter threshold; and
- independently changing, via the controller, the operating state of the first switching device of the sync-switch assembly based on the second approach.

18. The system of claim 16, wherein the approach of the at least one operating parameter of the power generating asset to the first parameter threshold and the second parameter threshold is a first approach to the first parameter threshold and the second parameter threshold, respectively, the plurality of operations further comprising:
- detecting a second approach of the power generating asset to the second parameter threshold; and
- independently changing the operating state of the second switching device of the sync-switch assembly based on the second approach.

* * * * *